(12) United States Patent
Suzuki et al.

(10) Patent No.: US 6,559,899 B1
(45) Date of Patent: May 6, 2003

(54) DIGITAL BLOCKS TELEVISION TUNER HAVING SIMPLE BASEBAND SIGNAL PROCESSING PORTION

(75) Inventors: Takao Suzuki, Fukushima-ken (JP); Akira Takayama, Fukushima-ken (JP); Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 329 days.

(21) Appl. No.: 09/598,966

(22) Filed: Jun. 21, 2000

(30) Foreign Application Priority Data

Jun. 22, 1999 (JP) .......................... 11-175180

(51) Int. Cl.$^7$ ............................. H04N 5/50; H04N 5/455

(52) U.S. Cl. ..................... 348/731; 348/641; 348/726

(58) Field of Search ............................... 348/731, 639, 348/641, 507, 508, 726, 727, 733, 725, 732; 375/324, 326, 321, 270; H04N 5/455, 5/50, 5/44, 9/66

(56) References Cited

U.S. PATENT DOCUMENTS 6,301,312 B1 * 10/2001 Limberg ..................... 348/726
6,373,883 B1 * 4/2002 Soerensen et al. .......... 375/324

FOREIGN PATENT DOCUMENTS

JP          11-341373        12/1999

* cited by examiner

Primary Examiner—Sherrie Hsia
(74) Attorney, Agent, or Firm—Brinks Hofer Gilson & Lione

(57) ABSTRACT

A digital television tuner is realized in which the construction of a baseband signal processing portion is simple, it is difficult for a local oscillation signal to leak to the input end side, and in which image interference is suppressed. The digital television tuner includes a frequency conversion device for converting the frequency of a digital television signal of a channel to be received from among channels arranged in a predetermined frequency band into the highest frequency of the frequency band or higher; two mixing devices for outputting two baseband signals whose phases are mutually orthogonal to each other by demodulating the frequency-converted digital television signal; a local oscillation device for inputting local oscillation signals whose phases are mutually orthogonal to each other to the two mixing devices; and an addition device for adding together the two baseband signals, wherein the frequency of the local oscillation signals is set to be the same frequency as the frequency at the end of the band in the channel of the frequency-converted digital television signal, and one of the baseband signals is converted into the same phase as that of the other, after which the signals are input to the addition device.

4 Claims, 3 Drawing Sheets

DIGITAL BLOCKS TELEVISION TUNER HAVING SIMPLE BASEBAND SIGNAL PROCESSING PORTION

BACKGROUND OF THE INVENTION

1. Field of the Invention

The present invention relates to a digital television tuner for demodulating a digital television signal which is transmitted in the form of what is commonly called a terrestrial wave and for outputting a baseband signal.

2. Description of the Related Art

FIG. 4 is a diagram of a representative digital television tuner of a direct conversion method, which has hitherto been conceived by the inventor of the present invention. A digital television signal (hereinafter referred to simply as a "television signal") of a channel (for example, a U.S. television channel) assigned between about 55 MHz and 806 MHz is input to an input end 41. The band of one channel is 6 MHz in a manner similar to the band of an existing analog television. The input television signal first passes through a baseband filter 42 and then a wide-band low-noise amplifier 43 and is input to two first mixers 44 and 45.

A first local oscillation signal for demodulation, which is output from a first local oscillator 46, is input to the first mixers 44 and 45. The frequency of the first local oscillation signal is the same as the center frequency of the band of a channel to be received, and the signal is input to one of the mixers (for example, the mixer 45) in such a manner as to be shifted in phase by 90° C. by a phase shifter 47. As a result, two baseband signals (I signal and Q signal) whose phases are mutually in an orthogonal relationship are output from the first mixers 44 and 45. Then, since the frequency of the first local oscillation signal is the same as the center frequency of the channel to be received, the baseband signals are output at a band of 3 MHz, which is almost half in a state in which one half of that band is folded around the center frequency.

One of the baseband signals (I signal) passes through a low-pass filter 48 and is input to an A/D (analog-to-digital) converter 49 whereby the signal is converted into a digital signal (called a digital I signal, and is referred to as a "DI signal" in FIG. 4), and the other (Q signal) passes through a low-pass filter 50 and is input to an A/D converter 51 whereby the signal is converted into a digital signal (called a digital Q signal, and is referred to as a "DQ signal" in FIG. 4). The frequency components of the digital I signal and the digital Q signal are distributed up to about a dozen MHz, although it depends on the sampling frequency at the time of digital conversion.

The first mixers 44 and 45 cover a wide frequency range (55 MHz to 806 MHz). For this reason, an imbalance occurs between the respective phases, gains, etc., of the I signal and the Q signal depending on the received channel. This imbalance is corrected by using one of them (for example, the digital Q signal in FIG. 4) as a reference and by digitally processing the phase, gain, etc., of the other (the digital I signal). As a construction for correcting, an orthogonal correction circuit 52, a second mixer 53, and a first adder 54 are provided.

Then, the digital Q signal is input to the orthogonal correction circuit 52 and the second mixer 53, and the digital I signal is input to the first adder 54. Also, the digital I signal whose phase, gain, etc., have been corrected is input to the orthogonal correction circuit 52. The orthogonal correction circuit 52 detects information to be corrected, such as the phase, the gain, etc., from the digital Q signal and the corrected digital I signal, and inputs it to the second mixer 53, whereby correction information is superimposed on the digital Q signal. Then, the digital Q signal on which the correction information is superimposed is input to the first adder 54, and the phase, the gain, etc., of the digital I signal are corrected.

The corrected digital I signal and the digital Q signal are input to third mixers 55 and 56, respectively, whereby they are mixed with a second local oscillation signal from a second local oscillator 57 and a phase shifter 58, the original band is widened again and, thereafter, is added by a second adder 59 and is output.

In the manner as described above, in the conventional construction, in order to obtain a baseband signal by directly demodulating a television signal of a received channel, a local oscillation signal (first local oscillation signal) having the same frequency as the center frequency of the band of the received channel is used. For this reason, there is a problem in that this local oscillation signal leaks to the input end 41 side. For the leakage of the local oscillation signal, only the reverse-direction transmission characteristics of the low-noise amplifier 43 function, but these are not sufficient to stop the leakage.

Also, since the band of the demodulated baseband signal (I and Q signals) becomes one half as large, a construction (the second local oscillator 57, the third mixers 55 and 56, and the phase shifter 58) for restoring the original band is required. Furthermore, since the first mixers 44 and 45 cover a channel of a wide band, an imbalance occurs in the performance between the two baseband signals, and a construction (the orthogonal correction circuit 52, the second mixer 53, and the first adder 54) for correcting this imbalance is required. Therefore, there is a problem in that the construction of the portion where the baseband signal is processed becomes complex.

SUMMARY OF THE INVENTION

Accordingly, an object of the present invention is to realize a digital television tuner which is simple in the construction of a baseband signal processing portion, in which it is difficult for a local oscillation signal to leak to the input end side, and in which image interference is suppressed.

To achieve the above-mentioned object, according to the present invention, there is provided a digital television tuner comprising a frequency conversion unit for converting the frequency of a digital television signal of a channel to be received from among channels arranged in a predetermined frequency band into the highest frequency of the frequency band or higher; two mixers for outputting two baseband signals whose phases are mutually orthogonal to each other by demodulating the frequency-converted digital television signal; a local oscillator for inputting local oscillation signals whose phases are mutually orthogonal to each other to the two mixers; and an addition unit for adding together the two baseband signals, wherein the frequency of the local oscillation signals is set to be the same frequency as the frequency at the end of the band in the channel of the frequency-converted digital television signal, and one of the baseband signals is converted into the same phase as the other, after which the signals are input to the addition unit.

Also, the digital television tuner of the present invention generates a local oscillation signal by using a pilot signal superimposed on the end of the band of the channel to be received.

Also, in the digital television tuner of the present invention, a Hilbert filter is provided between one of the mixers and the addition unit, and one of the baseband signals is input to the addition unit via the Hilbert filter.

Also, in the digital television tuner of the present invention, an analog-to-digital converter for converting the baseband signal into a digital signal is provided between each of the two mixers and the addition unit, and the Hilbert filter is provided between one of the analog-to-digital converters and the addition unit.

In the digital television tuner of the present invention, the frequency of the frequency-converted television signal is set to approximately 1 GHz.

The above and further objects, aspects and novel features of the invention will become more fully apparent from the following detailed description when read in conjunction with the accompanying drawings.

DESCRIPTION OF THE PREFERRED EMBODIMENT

A digital television tuner of the present invention will now be described with reference to FIGS. 1, 2, 3A, 3B, and 3C.

Figure 1:
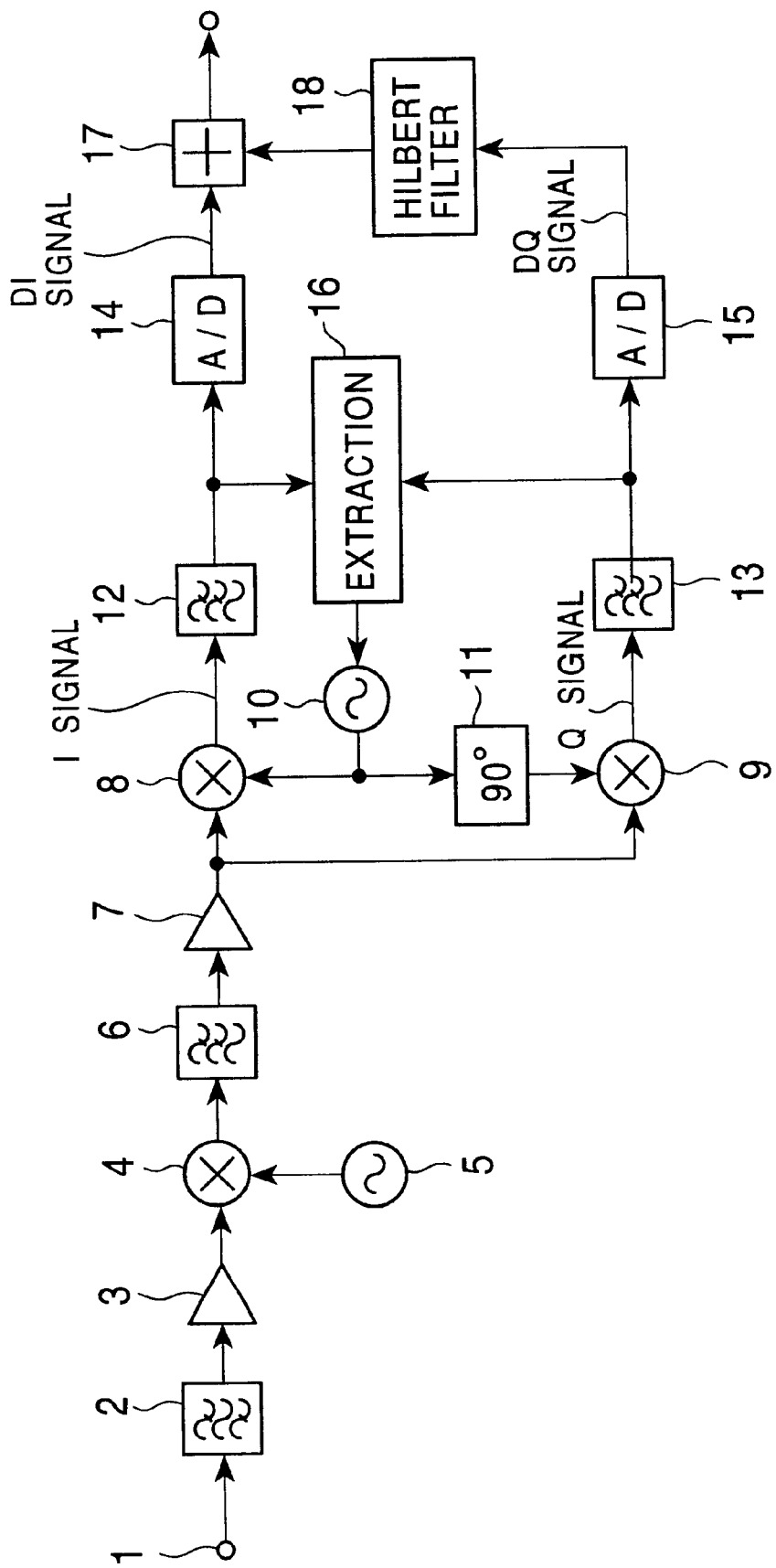
FIG. 1 is a diagram of a digital television tuner of the present invention.

FIG. 1 is a diagram of a digital television tuner of the present invention. A digital television signal (hereinafter referred to simply as a "television signal") input to an input end 1 first passes through a band-pass filter 2 and then a wide-band low-noise amplifier 3 and is input to a first mixer 4 which is a frequency converter. The input television signal is arranged in a channel (for example, a television channel in the U.S.) assigned within a predetermined frequency band from about 55 MHz to 806 MHz.

Figure 2A:
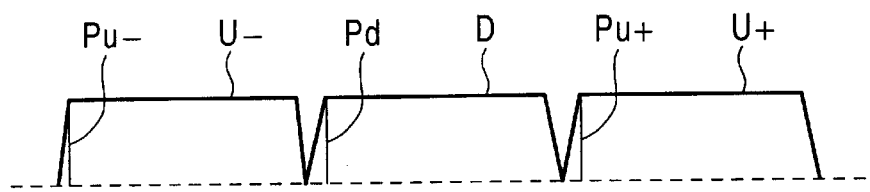
FIGS. 2A and 2B are comparison diagrams of signal levels before demodulation in the digital television tuner of the present invention.

The band of one band is 6 MHz, which is the same as that of the band of an existing analog television channel, and a pilot signal for reproducing a carrier is superimposed on the lower end of the band of each channel. FIG. 2A shows the state thereof, in which D is a channel to be received (referred to as a "received channel"), and Pd is a pilot signal thereof. Also, U_ is a channel to which the lower frequency is adjacent (referred to as a "lower adjacent channel"), Pu_ is a pilot signal thereof, U$_+$ is a channel to which the upper frequency is adjacent (referred to as an "upper adjacent channel"), and Pu$_+$ is a pilot signal thereof.

The band-pass filter 2 is composed of a division filter (not shown) which divides the frequency range from 55 MHz to 806 MHz into four portions for each passing band of a range of about one octave or lower, so that these can be switched according to the frequency of the television signal of the received channel. Therefore, interference of a frequency twice that of the other channels with respect to the received channel does not occur.

A first local oscillation signal for frequency conversion, which is output from a first local oscillator 5, is input to the first mixer 4. The first local oscillator 5 is controlled by a PLL (phase-locked loop) circuit (not shown), and the frequency of the first local oscillation signal varies from about 1055 MHz to 1806 MHz so that the difference becomes 1000 MHz in such a manner as to correspond to the frequency of the received channel. Therefore, the television signal (referred to as an "intermediate-frequency signal") of the received channel, which is frequency-converted to 1000 MHz, is obtained from the first mixer 4, and is extracted by an intermediate-frequency filter 6 provided at the subsequent stage. The intermediate-frequency filter 6 is composed of a band-pass filter, the center frequency is 1000 MHz, and the pass bandwidth is 6 MHz.

After the intermediate-frequency signal is amplified by an intermediate-frequency amplifier 7, it is input to two second mixers 8 and 9, which are mixers for demodulation. Since the frequency thereof is set to be higher than the highest frequency of the television signal which is input to the input end 1, the frequency of signals which cause image interference to occur becomes 2000 MHz or higher, and these signals are removed by the band-pass filter 2. Thus, image interference in the second mixers 8 and 9 is suppressed.

Figure 2B:
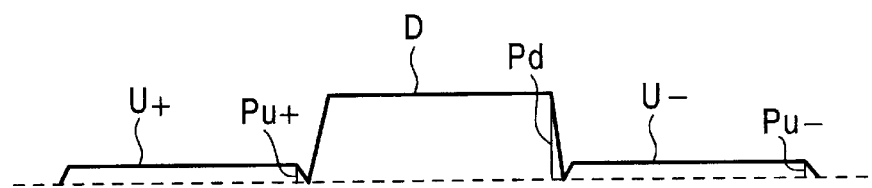

Due to the characteristics of the intermediate-frequency filter 6, the level of a television signal of two adjacent channels with respect to the level of the television signal of the received channel decreases as shown in FIG. 2B, and the pilot signal in the intermediate-frequency signal is positioned at the upper end of the band.

A second local oscillation signal for demodulation is input to the second mixers 8 and 9 from a second local oscillator 10 which is a local oscillator for demodulation, and the signal is input to one of the second mixers (the second mixer 9) in such a manner as to be shifted in phase by 90° C. by a phase shifter 11.

Here, since the frequency of the second local oscillation signal is controlled (to be described later) so that it becomes the same as that of the pilot signal Pd in the intermediate-frequency signal of the received channel, two baseband signals, which are mutually in an orthogonal relationship, of the band of 0 to 6 MHz are output from the second mixers 8 and 9, respectively. That is, an I signal (in-phase component) is output from one of the second mixers (the second mixer 8), and a Q signal (orthogonal component) is output from the other second mixer 9. However, the baseband signal of the lower adjacent channel is output at a low level. Since each baseband signal is subsequently processed digitally, after passing through low-pass filters 12 and 13, respectively, the signals are input to analog-to-digital converters (hereinafter referred to as "A/D converters") 14 and 15, respectively.

Then, since the pilot signal superimposed on the intermediate-frequency signal of the received channel is also output by slightly leaking from the second mixers 8 and 9 and the low-pass filters 12 and 13, this is extracted by a pilot signal extraction circuit 16, and based on this, control is performed by a PLL circuit (not shown) so that the oscillation frequency of the second local oscillator 10 becomes the same frequency as the pilot signal. Therefore, the second local oscillation signal can easily be generated by using the pilot signal.

Here, the angular frequency of the intermediate-frequency signal of the received channel is denoted as $\omega_1$, the angular frequency of the intermediate-frequency signal of the lower adjacent channel is denoted as $\omega_2$, both of which are shown representatively, and the angular frequency of the second local oscillation signal is denoted as ($\omega_0$, frequency components represented by $\sin\omega_0$, $\sin\omega_1$, and $\sin\omega_2$ are input to one of the second mixers (the second mixer 8), and frequency components represented by $\cos\omega_0$, $\sin\omega_1$, and $\sin\omega_2$ are input to the second mixer 9. Then, these signal components are mixed together, respectively, and a frequency component shown in equation (1) is output from one of the second mixers (the second mixer 8), and a frequency component shown in equation (2) is output from the other second mixer 9. In equations (1) and (2), only items necessary for explanation are shown.

$$I=-1/2\{\cos(\omega_0+\omega_1)-\cos(\omega_0-\omega_1)+\cos(\omega_0+\omega_2)-\cos(\omega_0-\omega_2)\} \quad (1)$$

$$Q=1/2\{\sin(\omega_0+\omega_1)-\sin(\omega_0-\omega_1)+(\sin(\omega_0+\omega_2)-\sin(\omega_0-\omega_2)\} \quad (2)$$

The terms $\cos(\omega_0+\omega_1)$ and $\cos(\omega_0+\omega_2)$ in equation (1) are removed by the low-pass filter 12, and in a similar manner, the terms $\sin(\omega_0+\omega_1)$ and $\sin(\omega_0+\omega_2)$ are removed by the low-pass filter 13. Therefore, an I signal shown in equation (3) is output from the low-pass filter 12, and a Q signal shown in equation (4) is output from the low-pass filter 13.

$$I=1/2\{\cos(\omega_0-\omega_1)+\cos(\omega_2-\omega_0)\} \quad (3)$$

$$Q=-1/2\{\sin(\omega_0-\omega_1)-\sin(\omega_2-\omega_0)\} \quad (4)$$

The term $\cos(\omega_0-\omega_1)$ in equation (3) is the baseband signal of the received channel, and the term $\cos(\omega_2-\omega_0)$ is the baseband signal of the lower adjacent channel. In a similar manner, the term $\sin(\omega_0-\omega_1)$ in equation (4) is the baseband signal of the received channel, and the term $\sin(\omega_2-\omega_0)$ is the baseband signal of the lower adjacent channel. These baseband signals of the lower adjacent channel become an image interference signal with respect to the baseband signal of the received channel. Since the angular frequency $\omega_2$ contained in the baseband signal of the lower adjacent channel is originally deviated from the passing band of the intermediate-frequency filter 6, the level of the baseband signal of the adjacent channel, containing $\omega_2$, is lower than the level of the baseband signal of the received channel.

Figure 3A:
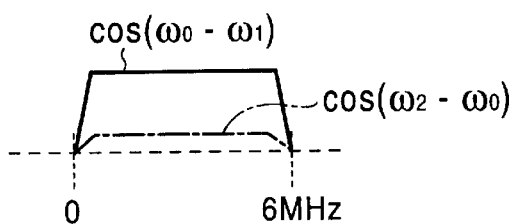
FIGS. 3A, 3B, and 3C are comparison diagrams of the level of a baseband signal and the polarity in the digital television tuner of the present invention.
Figure 3B:
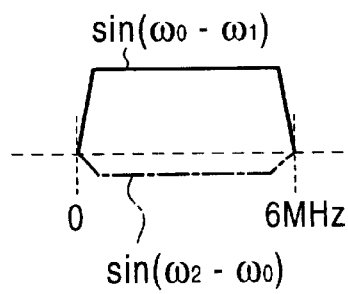

As is clear from these equations, the baseband signal of the received channel and the baseband signal of the lower adjacent channel in equation (3) have the same polarity, and the baseband signal of the received channel and the baseband signal of the lower adjacent channel in equation (4) have different polarities. Therefore, the relationship between the level and the polarity in one of the baseband signals (I signal) is as shown in FIG. 3A, and the relationship between the level and the polarity in the other (Q signal) is as shown in FIG. 3B.

To allow subsequent processing to be performed easily, the baseband signals are converted into digital signals (called a digital I signal and a digital Q signal, respectively, and referred to as a "DI signal" and a "DQ signal", respectively, in FIG. 1) by the A/D converters 14 and 15, respectively. The frequency components of the digital I signal and the digital Q signal are distributed up to about a dozen MHz, though they depend on the sampling frequency at the time of digital conversion.

Then, the digital I signal is input to an adder 17 which is an addition unit, and the digital Q signal is input to the adder 17 after passing through a Hilbert filter 18. The Hilbert filter 18 is based on the Hilbert conversion theory and functions to restore by 90° C. the phase of the digital Q signal to the original. Although the Hilbert filter 18 may be provided in a stage preceding the A/D converter 15, provision thereof in a stage subsequent to the A/D converter 15 makes easy digital processing possible. Also, the construction of the Hilbert filter 18 is simplified. The digital Q signal shown in equation (4) is converted into that shown in equation (5) after passing through the Hilbert filter 18.

$$Q'=1/2\{\cos(\omega_0-\omega_1)-\cos(\omega_2-\omega_0)\} \quad (5)$$

Figure 3C:
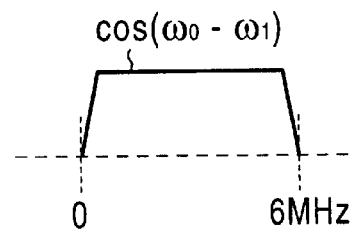
Figure 4:
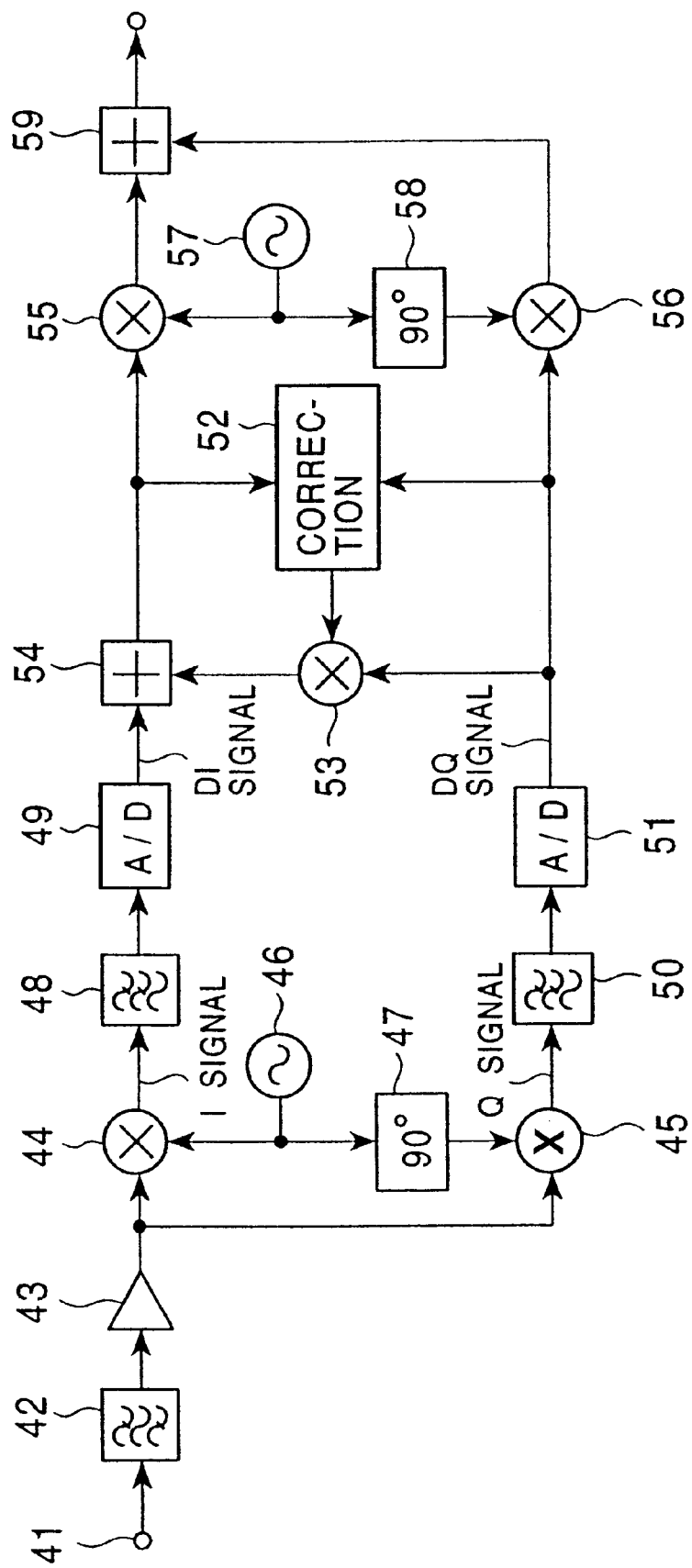
FIG. 4 is a diagram of a conventional digital television tuner.

Even after this conversion, the polarity between the baseband signal ($\cos(\omega_0-\omega_1)$) of the received channel and the baseband signal ($\cos(\omega_2-\omega_0)$) of the lower adjacent channel does not vary and the polarities remain mutually opposite. As a result, the baseband signal of the received channel in the digital Q signal becomes the same in phase and in polarity as those of the digital I signal, and is added by the adder 17. Also, since the baseband signal of the lower adjacent channel in equation (3) and the baseband signal of the lower adjacent channel in equation (5) become the same in phase and opposite in polarity, these are cancelled as a result of being added by the adder 17, and from the adder 17, only the digital baseband signal of the received channel shown in equation (6) and in FIG. 3C is extracted. Therefore, the baseband signal of the lower channel, which causes image interference, is removed.

$$E=\cos(\omega_0-\omega_1) \quad (6)$$

As described above, in the digital television tuner of the present invention, a digital television signal of a channel to be received is converted into the highest frequency of an input frequency band or higher, and it is input to a mixer for demodulation so that the frequency of a local oscillation signal which is input to the mixers when two baseband signals in an orthogonal relationship are output becomes the same frequency as the frequency at the end of the band of the received channel, and the two baseband signals are added together after one of the baseband signals is converted into the same phase as the phase of the other. Thus, image interference for the received channel can be eliminated. Also, image interference due to the demodulated baseband signal can also be eliminated. Furthermore, the construction is simplified.

Since the digital television tuner of the present invention generates a local oscillation signal by using a pilot signal superimposed on the end of the band of a channel to be received, it is possible to easily generate a local oscillation signal.

In the digital television tuner of the present invention, since a Hilbert filter is provided between one of the mixers and an addition unit, and one of the baseband signals is input to the addition unit via the Hilbert filter, one of the baseband signals can easily be converted into the same phase as that of the other.

In the digital television tuner of the present invention, since an analog-to-digital converter for converting a baseband signal into a digital signal is provided between each of two mixers and an addition unit, and a Hilbert filter is provided between one of the analog-to-digital converters and the addition unit, the construction of the Hilbert filter for converting one of the baseband signals into the same phase as that of the other is simplified, and processing thereof can be performed digitally.

In addition, in the digital television tuner of the present invention, since the frequency of the frequency-converted television signal is set to approximately 1 GHz, an image signal with respect to a received channel can be sufficiently removed.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A digital television tuner comprising:

a frequency connector to convert a frequency of a digital television signal of a channel to be received from among channels arranged in a predetermined frequency band into not less than a highest frequency of said frequency band;

two mixers to output two baseband signals whose phases are mutually orthogonal to each other by demodulating the frequency-converted digital television signal;

a local oscillator to input local oscillation signals whose phases are mutually orthogonal to each other to said two mixers;

an adder to add together said two baseband signals, wherein a frequency of said local oscillation signals is set to be a frequency at an end of the band in the channel of the frequency-converted digital television signal, and the phase of one of said baseband signals is converted into the phase of the other baseband signal, after which the baseband signals are input to said adder; and a Hilbert filter provided between one of said mixers and said adder, wherein one of said baseband signals is input to said adder via said Hilbert filter.

2. A digital television tuner according to claim 1, wherein said local oscillation signals are generated by using a pilot signal superimposed at the end of the band of said channel to be received.

3. A digital television tuner according to claim 1, further comprising an analog-to-digital converter, provided between each of said two mixers and said adder to convert each of said baseband signals into a digital signal, wherein said Hilbert filter is provided between one of said analog-to-digital converters and said adder.

4. A digital television tuner according to claim 1, wherein the frequency of the frequency-converted television signal is set to about 1 GHz.

* * * * *